Oct. 5, 1971 SAKAE KIKUCHI 3,609,857

SEMICONDUCTOR DEVICE AND METHOD OF MANUFACTURING THE SAME

Filed Nov. 4, 1968

INVENTOR

SAKAE KIKUCHI

BY Craig & Antonelli

ATTORNEYS

United States Patent Office 3,609,857
Patented Oct. 5, 1971

3,609,857

SEMICONDUCTOR DEVICE AND METHOD OF MANUFACTURING THE SAME

Sakae Kikuchi, Kodaira-shi, Japan, assignor to Hitachi, Ltd., Tokyo, Japan

Filed Nov. 4, 1968, Ser. No. 772,911
Claims priority, application Japan, Nov. 6, 1967, 42/70,964
Int. Cl. B01j *17/00;* H01l *7/02*
U.S. Cl. 29—589 2 Claims

ABSTRACT OF THE DISCLOSURE

A method for manufacturing a semiconductor device, which comprises the steps of fusing an indium collector dot of an alloy type transistor on the surface of a metal support plated by tin, thereby fixing said transistor electrically and mechanically firmly on said metal support.

BACKGROUND OF THE INVENTION

Field of the invention

This invention relates to a method for manufacturing a semiconductor device, and more particularly to a method for fixing firmly a junction type semiconductor element upon a support so as to increase the thermal radiation.

Description of the prior art

It is known that semiconductor devices such as transistors and diodes generate unwanted heat during employment and change the operation characteristic, or stop the operation when the temperature is raised above a certain limit. Therefore, it is necessary in the manufacture of such devices, specifically devices requiring a large electric power, to radiate effectively the heat generated in operation.

In an alloy junction type transistor generally used in practice as a power transistor it is generally practiced to solder the collector electrode, projecting from one surface of semiconductor substrate and alloyed with the substrate to make a junction, directly upon a metal support to radiate heat effectively therethrough. However, since the collector electrode portion is made of relatively low melting point metal, it has been technically difficult to fuse the electrode on a metal support without causing thermal damage to the alloy junction.

SUMMARY OF THE INVENTION

One object of this invention is to provide an improved method for fixing a semiconductor element to a metal support and increasing the heat radiation without harming the junction structure.

Another object of this invention is to provide such improved semiconductor devices at low cost.

According to one embodiment of this invention is provided a manufacturing method comprising preparing a metal film, or disposing a metal thin plate, on the surface of a metal support, contacting a projecting metal electrode of a semiconductor element with the metal film, heating them at a temperature where a portion of the metal electrode and the metal film form a eutectic, and cooling the eutectic down to a temperature where it will be solidified. In other words, one the characteristics of this invention is that the heat treatment is performed at a temperature lower than the melting points of the metal electrode and of the metal film, but not lower than the eutectic temperature of the metals constituting said metal electrode and metal film.

DESCRIPTION OF THE PREFERRED EMBODIMENTS

The embodiments of this invention will be explained hereinafter with reference to the drawings.

Figure 1:
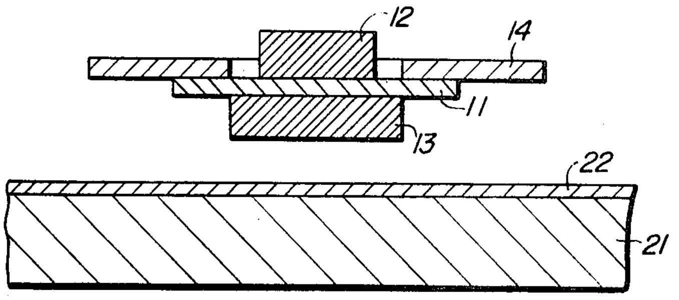
FIGS. 1 to 3 are sectional views showing successive manufacturing steps in accordance with a method for fixing an alloy junction type transistor to a support according to one embodiment of this invention.

In FIG. 1, 11 is an N type germanium semiconductor substrate, and 12 and 13 are P type rectifying electrodes of low melting point metal mainly of indium, disposed and alloyed coaxially on the opposed principal surfaces of said semiconductor substrate. Thus a PNP junction type transistor is formed with the substrate 11 as the base and with the electrodes 12 and 13 as the emitter and the collector. 14 is a metal plate in ohmic contact with the substrate 11. 21 is a metal support to fit the above transistor, which is made of metal having good electrical and thermal conductivities, e.g. copper and iron. 22 is a tin plating layer 2 to 15$\mu$ thick coated on the whole surface of the metal support 21 or at least on the portion for fitting the element. (The melting point of tin is about 230° C.) To prevent the surface of the support 21 from suffering from corrosion, it is desirable for the tin plating layer 22 to cover the whole surface of the support.

Figure 2:
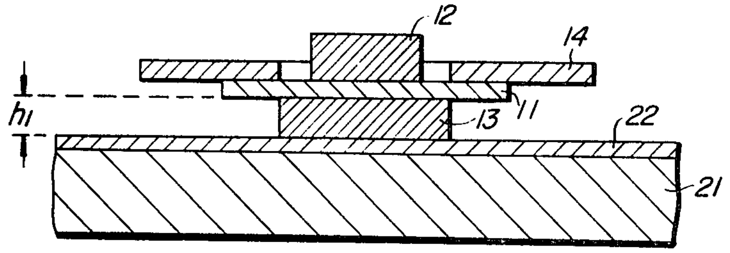

In FIG. 2, the bottom electrode 13 i.e. the collector electrode of the transistor element is made to contact with the tin plating layer 22 on the metal support. The body is heated at a temperature about 140° C. lower than the melting point of the electrode (about 156° C.) and that of the plated tin layer.

The heat treatment is desirably done by dipping the whole device for one to two minutes in the liquid which is inactive against the semiconductor element, i.e. an organic substance such as glycerin, maintained at a temperature between 140° C. and 145° C.

Figure 3:
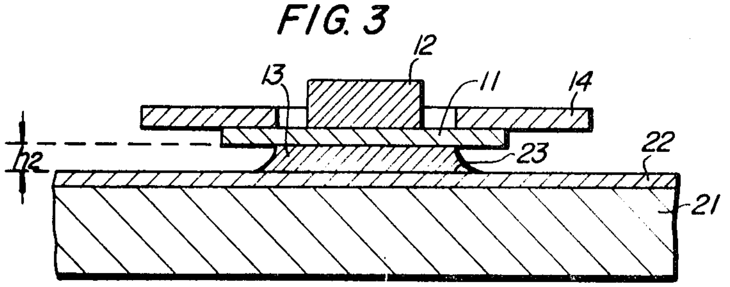

FIG. 3 shows the device, taken out of the solution after heating, the contact portion between the collector electrode and the metal support being cooled to solid. By heating indium, the major gradient of the electrode 13 is partially fused in the tin portion on the metal support while a portion of the tin plating layer is fused in the indium electrode portion, forming Sn-In eutectic. The melting point of the eutectic is about 117° C. (In 50%–Sn 50%).

As shown in the FIG. 3, the diameter of the alloy portion 23 between the electrode and the support expands 1.2 times as large as that of the contact portion before the heat treatment. At the same time the height $h_2$ of the electrode 13 after the heat treatment is observed to decrease from the height $h_1$ before heating. It is to be noted that the eutectic portion formed between the electrode 13 and the tin plating layer 22 spreads over the surface of the support and causes no harm to the PN junction portion in the semiconductor substrate 11. The collector electrode 13 forms a eutectic alloy region with the tin plating layer on the support over a larger area than that between the electrode and the germanium substrate. Further, the height of the electrode is decreased. Therefore, the heat radiation from the collector junction becomes large and the transistor is mechanically firmly fixed to the support.

As evident from the foregoing explanation, the invention makes it easy to fix a projecting electrode of a junction type semiconductor element to a metal supporting plate, which has been difficult by a prior technique, and promotes the thermal radiation of the semiconductor device in operation thereby improving the electrical characteristic.

Although explanation of the above embodiment has been made of a PNP type transistor, this invention can of course be applied to other semiconductor devices.

What is claimed is:

1. A method for manufacturing a germanium semiconductor device comprising the steps of:

coating a metal layer of tin on at least a portion of a surface of a metal support;

alloying a projecting metal electrode consisting mainly of indium to one portion of a principal surface of a germanium semiconductor substrate so as to form a p-n junction between the electrode and the substrate;

contacting said electrode with said coated portion of said support, and heating the metal support to a temperature lower than 156° C. but at least to the eutectic temperature of an indium-tin eutectic so as to form an indium-tin alloyed contact between said metal support and said germanium semiconductor substrate without affecting the junction.

2. A method for manufacturing a semiconductor device according to claim 1, said metal support is mainly of one of copper and iron.

References Cited

UNITED STATES PATENTS

| | | | |
|---|---|---|---|
| 3,200,490 | 8/1965 | Clymer | 29—589 UX |
| 3,274,454 | 9/1966 | Haberecht | 29—576(J) UX |
| 3,418,544 | 12/1968 | France et al. | 29—589 X |
| 3,495,323 | 2/1970 | Fournier | 29—498 X |

JOHN F. CAMPBELL, Primary Examiner

W. TUPMAN, Assistant Examiner

U.S. Cl. X.R.

29—498